United States Patent
Yamaguchi et al.

(10) Patent No.: US 6,930,335 B2
(45) Date of Patent: Aug. 16, 2005

(54) FIELD EFFECT TRANSISTOR WITH METAL OXIDE GATE INSULATOR AND SIDEWALL INSULATING FILM

(75) Inventors: Takeshi Yamaguchi, Kawasaki (JP); Hideki Satake, Chigasaki (JP); Noburu Fukushima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 156 days.

(21) Appl. No.: 10/397,308

(22) Filed: Mar. 27, 2003

(65) Prior Publication Data

US 2003/0209816 A1 Nov. 13, 2003

(30) Foreign Application Priority Data

Mar. 27, 2002 (JP) ........................................ 2002-089955

(51) Int. Cl.[7] ............................................. H01L 29/76
(52) U.S. Cl. ..................... 257/288; 257/368; 257/410; 257/411
(58) Field of Search .................................. 257/288, 318, 257/368, 410, 411, 632, 639, 649; 438/639, 649

(56) References Cited

U.S. PATENT DOCUMENTS

| | | | | |
|---|---|---|---|---|
| 5,134,451 A | * | 7/1992 | Katoh | ........................ 257/384 |
| 5,783,475 A | * | 7/1998 | Ramaswami | ................ 438/303 |
| 6,465,334 B1 | * | 10/2002 | Buynoski et al. | ........... 438/591 |
| 6,486,080 B2 | * | 11/2002 | Chooi et al. | ................ 438/785 |
| 6,531,324 B2 | * | 3/2003 | Hsu et al. | ...................... 438/3 |
| 6,784,508 B2 | * | 8/2004 | Tsunashima et al. | ........ 257/411 |

OTHER PUBLICATIONS

Ogawa, S., et al., Silicon–Aluminum Oxynitride Composite Films Deposited by Reactive Ion Beam Sputtering, Ion Implantation Technology Proceedings, 1998 International Conference, vol. 2, Jun. 22–26, 1998, pp. 775–778.*

Toshihiko Miyashita, et al., "Experimental Evaluation of Depth–Dependent Lateral Standard Deviation For Various Ions In a–Si From One–Dimensional Tilted Implatation Profiles", IEEE Transactions on Electron Devices, vol., 46, No. 9, Sep. 1999, pp. 1824–1828.

David H. Lim et al., "An Accurate and Computationally-Efficient Model of Boron Implantation Through Screen Oxide Layers Into (100) Single–Crystal Silicon", 1991 IEDM Tech. Dig. (1993), pp. 291–294.

* cited by examiner

Primary Examiner—T. N. Quach
(74) Attorney, Agent, or Firm—Oblon, Spivak, McClelland, Maier & Neustadt, P.C.

(57) ABSTRACT

Provided is a semiconductor device including a silicon substrate, a gate insulator disposed on the silicon substrate and containing a metal oxide, a gate electrode disposed on the gate insulator, and a sidewall insulating film disposed on a side of the gate insulator and the gate electrode and containing aluminum, silicon, oxygen and nitrogen.

14 Claims, 6 Drawing Sheets

FIELD EFFECT TRANSISTOR WITH METAL OXIDE GATE INSULATOR AND SIDEWALL INSULATING FILM

CROSS-REFERENCE TO RELATED APPLICATIONS

This application is based upon and claims the benefit of priority from the prior Japanese Patent Application No. 2002-089955, filed Mar. 27, 2002, the entire contents of which are incorporated herein by reference.

BACKGROUND OF THE INVENTION

1. Field of the Invention

The present invention relates to a semiconductor device including a MISFET (Metal Insulator Semiconductor Field Effect Transistor) in which the gate insulator contains a metal oxide, and a method of manufacturing the same.

2. Description of the Related Art

The improvements in the operating speed and in the degree of integration of an LSI (Large Scale Integrated) circuit are being promoted by the miniaturization of the MOS (Metal Oxide Semiconductor) device conforming with the scaling law. In the scaling law, the sizes of each portion of the MOS device such as the thickness of the insulating film and the gate length are reduced in substantially the same ratio in the height direction and the horizontal direction. As a result, it is possible to maintain or improve the characteristics of the device.

In next generation MOS transistors, the equivalent silicon oxide film thickness (Equivalent Physical Oxide Thickness, hereinafter referred to as "EOT"), which is the thickness of the gate insulator converted into the thickness of the silicon oxide film on the basis of the dielectric constant, is required to be not larger than 2 nm. However, if a silicon oxide film is used as a gate insulator, the EOT value noted above fails to sufficiently suppress the current leakage and, thus, a problem is generated that the power consumption is increased.

Under the circumstances, it is being studied in recent years to use a material having a dielectric constant higher than that of silicon oxide, such as a metal oxide or a silicate of silicon dioxide and metal oxide, as the material of the gate insulator for next generation MOS transistors. If such a material having a high dielectric constant is used for forming a gate insulator, it is possible to increase the actual thickness of the gate insulator so as to sufficiently suppress the current leakage, and to achieve an EOT value not larger than 2 nm.

BRIEF SUMMARY OF THE INVENTION

According to a first aspect of the present invention, there is provided a semiconductor device comprising a silicon substrate, a gate insulator disposed on the silicon substrate and containing a metal oxide, a gate electrode disposed on the gate insulator, and a sidewall insulating film disposed on a side of the gate insulator and the gate electrode and containing aluminum, silicon, oxygen and nitrogen.

According to a second aspect of the present invention, there is provided a semiconductor device comprising a silicon substrate, a gate insulator disposed on the silicon substrate and containing a metal oxide, a gate electrode disposed on the gate insulator, and a sidewall insulating film disposed on a side of the gate insulator and the gate electrode and having a network structure constructed by aluminum, silicon, oxygen and nitrogen.

According to a third aspect of the present invention, there is provided a method of manufacturing a semiconductor device, comprising forming a gate insulator containing a metal oxide on a silicon substrate, forming a gate electrode on the gate insulator, forming a sidewall insulating film containing aluminum, silicon, oxygen and nitrogen on a side of the gate insulator and gate electrode, and after forming the sidewall insulating film, introducing an impurity into a surface region of the silicon substrate by ion implantation.

Further, according to a fourth aspect of the present invention, there is provided a method of manufacturing a semiconductor device, comprising forming a gate insulator containing a metal oxide on a silicon substrate, forming a gate electrode on the gate insulator, forming a sidewall insulating film having a network structure constructed by aluminum, silicon, oxygen and nitrogen on a side of the gate insulator and gate electrode, and after forming the sidewall insulating film, introducing an impurity into a surface region of the silicon substrate by ion implantation.

In each of the first to fourth aspects of the present invention, it is possible for at least a part of the sidewall insulating film to have a composition represented by the general formula given below:

$$Si_{6-z}Al_zO_zN_{8-z}$$

where z is a value larger than 0 and smaller than 6.

It is possible for the sum of concentrations of aluminum, silicon, oxygen and nitrogen in the sidewall insulating film to be 97 atomic % or more. Also, it is possible for the thickness of the sidewall insulating film in a direction parallel to the main surface of the silicon substrate to fall within a range of between 3 nm and 10 nm. Further, it is possible for the aluminum concentration in the sidewall insulating film to be 10 atomic % or more. Still further, it is possible for the nitrogen concentration in the sidewall insulating film to be 5 atomic % or more.

It is possible for the material of the gate insulator to contain at least one metal element selected from the group consisting of zirconium, hafnium, lanthanum, cerium, titanium, yttrium, tantalum, bismuth, and praseodymium as the constituting metal element. Also, it is possible for the material of the gate insulator to be an oxide of any of the metal elements noted above or a silicate of the metal oxide and silicon dioxide.

DETAILED DESCRIPTION OF THE INVENTION

Figure 1:
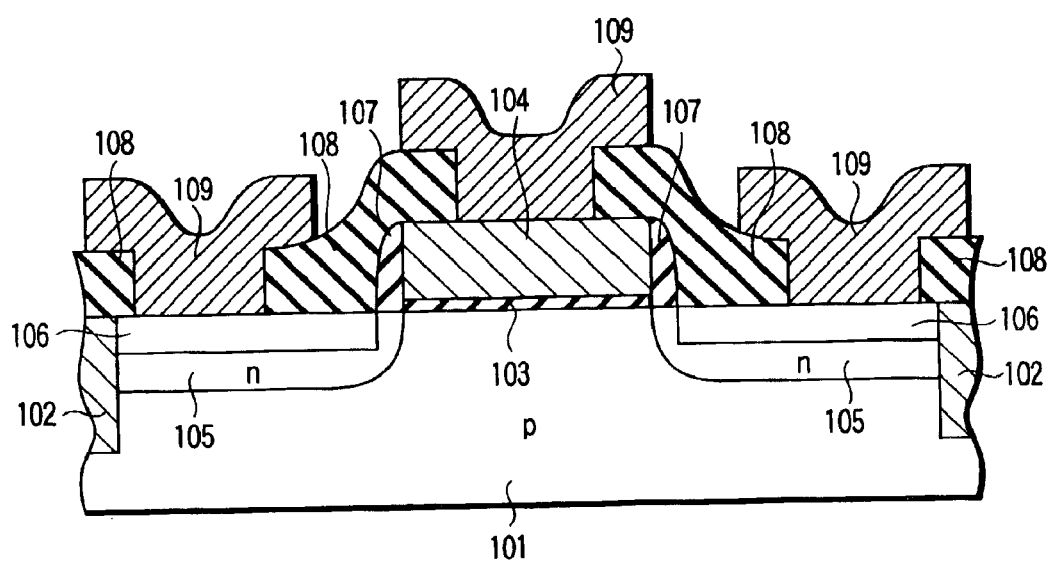
FIG. 1 is a cross sectional view schematically showing the construction of a semiconductor device according to one embodiment of the present invention.

One embodiment of the present invention will now be described with reference to the accompanying drawings. In the accompanying drawings, the constituting elements performing the same or similar functions are denoted by the same reference numerals so as to avoid an overlapping description.

FIG. 1 is a cross sectional view schematically showing the construction of a semiconductor device according to one embodiment of the present invention. In FIG. 1, a reference numeral 101 denotes a p-type silicon substrate, and a reference numeral 102 denotes a device isolating region. A gate electrode 104 is formed on a device forming region, i.e., a surface region surrounded by the device isolating region 102 of the silicon substrate 101, with a gate insulator 103 interposed therebetween.

The material of the gate insulator 103 contains as a main component a metal oxide. For example, the material of the gate insulator 103 is provided by a metal oxide having a high dielectric constant, such as $HfO_2$. Alternatively, the material of the gate insulator is provided by a silicate of metal oxide and silicon dioxide having a high dielectric constant, such as a silicate of $Hf_2O$ and $SiO_2$.

The material of the gate electrode 104 is provided by, for example, a polycrystalline silicon (polysilicon) containing an impurity. Alternatively, the material of the gate electrode 104 is provided by a metal or a conductive metallic compound, such as a metal nitride represented by TiN or TaN, a metal represented by W, Nb or Ru, or a metal oxide represented by ruthenium oxide.

N-type impurity layers 105 are formed in a surface region of the substrate 101 in a manner to have the gate electrode 104 sandwiched therebetween. The impurity layers 105 are shallow impurity diffusion layers (source and drain regions) formed by an ion implantation of, for example, As under an energy of about 40 keV. In the example shown in the drawing, a silicide layer 106 containing Ni or Co is formed on the impurity layer 105.

A sidewall insulating film 107 containing Si, Al, O and N in the form of, for example, a Si—Al—O—N compound or solid solution (hereinafter referred to simply as "Si—Al—O—N") is formed on the side surfaces of the gate insulator 103 and the gate electrode 104.

The concentration of each element contained in the sidewall insulating film is, for example, 25 atomic % for Si, 18 atomic % for Al, 18 atomic % for O and 39 atomic % for N.

Further, an interlayer insulating film 108 such as a CVD (Chemical Vapor Deposition) silicon oxide film is formed on the surface of the substrate 101 on which is formed, for example, the gate electrode 104. Contact holes for connection to the gate and the source/drain regions are formed in the interlayer insulating film 108. Also, wirings 109 such as Al wirings, which are connected to the gate electrode 104 and to the silicide layer 106 formed on the source and drain regions 105, are buried in the contact holes.

The MISFET shown in FIG. 1 can be manufactured by, for example, the method described in the following.

FIGS. 2A to 2I are cross sectional views collectively exemplifying a method that can be employed for the manufacture of the MISFET shown in FIG. 1.

Figure 2A:
FIGS. 2A to 2I are cross sectional views collectively exemplifying a method that can be utilized for the manufacture of the MISFET shown in FIG. 1.

First, prepared is a p-type silicon substrate 101 having, for example, the (100) face exposed to the outside and having a resistivity of about 4 Ωm to 6 Ωm, as shown in FIG. 2A. Then, a groove for the device isolation is formed in the substrate 101 by a reactive ion etching, followed by filling the resultant groove with, for example, an LP (Low Pressure)-TEOS (Tetra Ethyl Ortho Silicate) film so as to obtain the device isolating region 102. Incidentally, in FIG. 2A, the device isolating region 102 protrudes from the substrate 101. However, it is possible for the upper surface of the device isolating region 102 to be flush with the upper surface of the substrate 101.

Figure 2B:
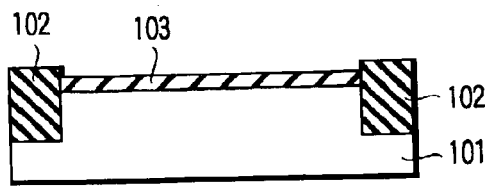

Next, the gate insulator 103 is formed by, for example, a laser abrasion method, as shown in FIG. 2B. For example, a $HfO_2$ film having a thickness of 5 nm is formed as the gate insulator 103 by the laser abrasion method in which the oxygen partial pressure within the atmosphere is set at 1 Pa to 100 Pa and the substrate temperature is set at 400° C.

Incidentally, in the case of using a metal oxide as the material of the gate insulator 103, the method of forming the gate insulator 103 can be modified in various ways.

For example, it is possible to form the gate insulator 103 by a sputtering method. To be more specific, it is possible to deposit a Hf film or a $HfO_2$ film having a thickness of 3 nm on the silicon substrate 101 by the sputtering method in which the oxygen partial pressure within the atmosphere is set at 1 Pa to 5 Pa and the substrate temperature is set to fall within a range of between room temperature and 300° C., followed by annealing the deposited Hf film or $HfO_2$ film under an oxygen or nitrogen atmosphere at 400° C. to 1,000° C. so as to form a $HfO_2$ film as the gate insulator 103.

It is also possible to form the gate insulator 103 by an evaporation method. For example, a Hf film or a $HfO_2$ film is deposited in a thickness of 4 nm on the silicon substrate 101 by an evaporation method in which the substrate temperature is set to fall within a range of between room temperature and 300° C., followed by annealing the resultant Hf or $HfO_2$ film under an oxygen or nitrogen atmosphere at 600° C. to 800° C. so as to form a $HfO_2$ as the gate insulator 103.

Further, it is possible to form the gate insulator 103 by a CVD method. For example, a mixed gas containing Hf, such as a mixed gas containing a $C_{16}H_{36}HfO_4$ gas and an oxygen gas, a mixed gas containing a $HfCl_4$ gas and an $NH_3$ gas, or a mixed gas containing a $Hf(SO_4)_2$ gas and an $NH_3$ gas is used as the raw material gas. Also, the pressure is set at 1 Pa to $10^4$ Pa, the flow rate is set at 1 sccm to 1,000 sccm, and the substrate temperature is set at room temperature to 800° C. It is possible to deposit a film containing Hf on the silicon substrate 101 by, for example, a CVD method under the conditions given above, followed by annealing the deposited film under an oxygen or nitrogen atmosphere having a temperature of 500° C. to 900° C. so as to form a $HfO_2$ film as the gate insulator 103.

In the case of using a silicide as the material of the gate insulator, the gate insulator 103 can be formed by, for example, the method given below.

For example, the gate insulator 103 can be formed by a laser abrasion method. To be more specific, it is possible to form a Hf silicate film having a thickness of 5 nm and containing Hf, Si and O as the gate insulator 103 by, for example, the laser abrasion method in which the oxygen partial pressure within the atmosphere is set to fall within a range of between 1 Pa and 100 Pa, the substrate temperature is set at 400° C., and the target used contains Hf, Si and O atoms.

It is also possible to form the gate insulator 103 by a sputtering method. For example, it is possible to deposit a Hf film, a Hf silicide film or a Hf silicate film to a thickness of 3 nm on the silicon substrate 101 by a sputtering method in which the oxygen partial pressure within the atmosphere is set at 1 Pa to 5 Pa and the substrate temperature is set at 300° C., followed by annealing the deposited film within an oxygen or nitrogen atmosphere under the temperature of 400° C. to 800° C. so as to form a Hf silicate film as the gate insulator 103.

It is also possible to form the gate insulator 103 by an evaporation method. For example, a Hf film or a Hf silicide film is deposited in a thickness to 4 nm on the silicon substrate 101 by an evaporation method in which the substrate temperature is set at 200° C., followed by annealing the deposited film under an oxygen atmosphere at the temperature of 600° C. to 800° C. so as to form a Hf silicate film as the gate insulator 103.

Figure 2C:
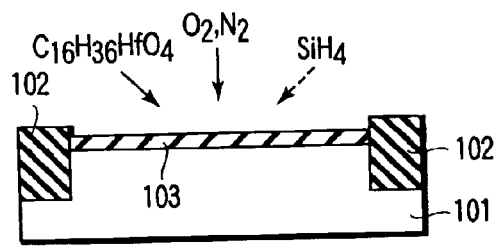

It is also possible to form the gate insulator 103 by a CVD method. For example, a mixed gas containing Hf and Si such as a mixed gas containing a $C_{16}H_{36}HfO_4$ gas, a monosilane ($SiH_4$) gas, an oxygen gas and a nitrogen gas as shown in FIG. 2C, a mixed gas containing a $HfCl_4$ gas and a $SiH_4$ gas or a mixed gas containing a $Hf(SO_4)_2$ gas, an $NH_3$ gas and a $SiH_4$ gas is used as the raw material gas. Also, the pressure is set at 1 Pa to $10^4$ Pa, the flow rate is set at 1 sccm to 1,000 sccm, and the substrate temperature is set to fall within a range of between room temperature and 800° C. Under the conditions given above, a film containing Hf and Si is deposited on the silicon substrate 101 by the CVD method, followed by annealing the deposited film under an oxygen atmosphere of 600° C. to 900° C. so as to form a Hf silicate film as the gate insulator 103.

Figure 2D:
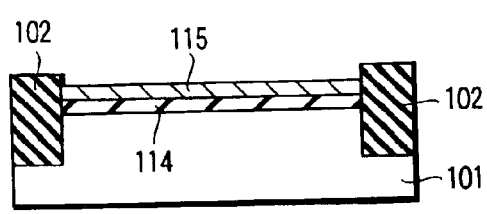
Figure 2E:
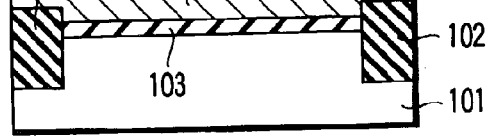

It is also possible to form an oxide film on the surface of the silicon substrate 101, followed by depositing a metal on the oxide film and subsequently diffusing the metal element into the oxide film by the heating so as to form a silicate film. For example, a $SiO_2$ film 114 is formed first to a thickness of about 1 nm to 4 nm on the silicon substrate 101 by the heating (burning oxidation: BOX) of the silicon substrate 101 under an oxygen atmosphere or a CVD method as shown in FIG. 2D. Then, a film 115 containing Hf is formed on the $SiO_2$ film 114 by, for example, an evaporation method using a Hf target or a target containing Hf and Si, followed by diffusing Hf contained in the film 115 into the $SiO_2$ film by the heating at 400° C. to 900° C. under, for example, vacuum or a nitrogen atmosphere. In this fashion, it is possible to form a Hf silicate film as the gate insulator 103.

A thin film 104 used as a gate electrode is formed on the gate insulator 103 by, for example, the method described above as shown in FIG. 2E. For example, a polysilicon film is formed by a CVD method, followed by applying a phosphorus diffusing treatment using, for example, phosphorus oxychloride ($POCl_3$) to the polysilicon film at 850° C. for 30 minutes so as to lower the resistivity of the polysilicon film. Incidentally, the introduction of an impurity into the polysilicon film can be performed later, e.g., in the subsequent step of the ion implantation for forming the diffusion layer 105. Alternatively, it is possible to form a polysilicon film doped with an impurity such as Ge in place of the polysilicon film.

Figure 2F:
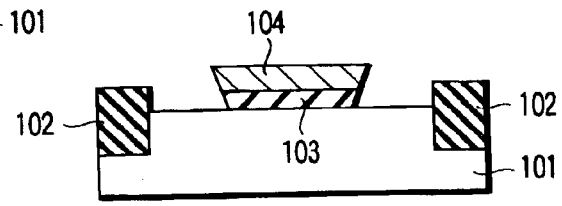
Figure 2G:
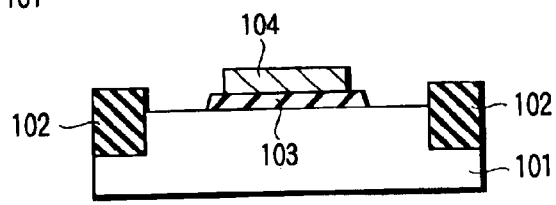

Next, the film 104 is patterned so as to form a gate electrode as shown in FIG. 2F. It is possible to pattern the gate insulator 103 together with the patterning of the film 104. Also, there is no particular limitation in respect of the position of the side surface of the gate electrode 104 relative to the side surface of the gate insulator 103 and the angle made between these side surfaces and the main surface of the substrate 101. For example, it is possible for the gate electrode 104 to have a width larger than that of the gate insulator 103 as shown in FIG. 2F or for the gate insulator 103 to have a width larger than that of the gate electrode 104 as shown in FIG. 2G. It is also possible for the side surfaces of the gate insulator 103 and the gate electrode 104 to be inclined relative to the main surface of the substrate 101, as shown in FIG. 2F.

Figure 2H:
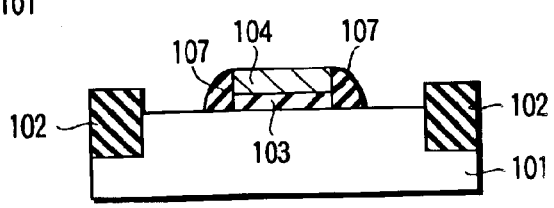

Next, a sidewall insulating film 107 containing Si—Al—O—N is formed on the side surfaces of the gate insulator 103 and the gate electrode 104, as shown in FIG. 2H. The sidewall insulating film 107 can be formed by, for example, the method described below. Specifically, in the first step, a Si—Al—O—N film is formed to a thickness of about 5 nm to 30 nm by, for example, a CVD method in a manner to cover the side surfaces of the gate insulator 103 and the gate electrode 104, followed by etching the Si—Al—O—N film by, for example, a RIE (Reactive Ion Etching) method. As a result, it is possible to remove that portion of the Si—Al—O—N film which is positioned on the substrate 101, while leaving unremoved those portions of the Si—Al—O—N film which are positioned on the side surfaces of the gate insulator 103 and the gate electrode 104. In this fashion, the sidewall insulating film 107 can be formed in a self-aligned manner.

Figure 2I:
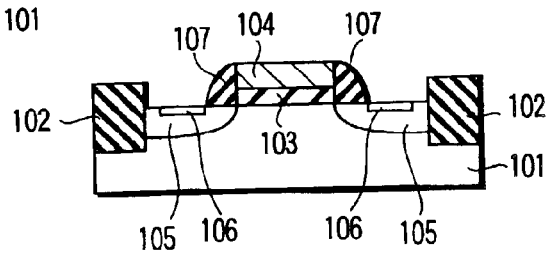

Next, the source and drain regions 105 are formed by utilizing an ion implantation method as shown in FIG. 2I. For example, arsenic is introduced into a surface region of the substrate 101 at a dose of $1 \times 10^{15}$ cm$^{-2}$ by means of an ion implantation method under an acceleration energy of 70 keV, followed by applying a heat treatment at, for example, 900° C. for 10 minutes or at 1,000° C. for 30 seconds so as to obtain the source and drain regions 105.

After formation of the source and drain regions 105, the silicide layer 106 is formed as required. It is possible to lower the resistivity of the source and drain regions 105 by forming the silicide layer 106. The silicide layer 106 can be formed, for example, by forming a Ni or Co layer by means of an evaporation method, followed by applying a heat treatment to the deposited Ni layer or Co layer.

Then, the interlayer insulating film 108 and the wiring 109 are formed by the ordinary manufacturing process so as to finish preparing the MISFET shown in FIG. 1. For example, the silicon oxide layer 108 is formed by a CVD method, followed by forming contact holes in the silicon oxide film 108. Then, an Al film 109 is formed in a manner to fill these contact holes, followed by patterning the Al film 109 by utilizing a RIE method.

The present inventors have found in arriving at the present invention that the phenomenon described below takes place in the manufacture of an ordinary FET in which the gate insulator contains a metal. Specifically, since the gate insulator of the FET contains a metal in a very high concentration, a large amount of the metal is diffused from the gate insulator to the outside by the ion implantation for forming the source and drain regions. As a result, the inner wall of the chamber of the manufacturing apparatus, etc.

tends to be contaminated with the metal diffused from the gate insulator. This may well cause deterioration in the performance and the yield of the device.

The present inventors considered that it would be possible to suppress the diffusion of the metal from the gate insulator into the atmosphere by a suitable structured sidewall insulating film utilized in the technology for realizing the miniaturization, while suppressing the short channel effect such as a salicide technology. Such being the situation, the present inventors calculated the diffusion of Zr caused by the ion implantation in the case of using a Zr silicate film containing 15 atomic % of Zr as the gate insulator and a $SiO_2$ film as the sidewall insulating film. The calculation was performed on the assumption that As would be introduced by means of an ion implantation under an acceleration energy of about 60 keV at an angle of 45° relative to the sidewall insulating film and a dose of As would set at $5 \times 10^{15}$ $cm^{-2}$. As a result, it has been found that, in the case of using a Zr silicate film as the gate insulator and a $SiO_2$ as the sidewall insulating film, it is necessary for the sidewall insulating film to have a thickness larger than about 10 nm in order to suppress sufficiently the diffusion of Zr from the gate insulator into the atmosphere.

The thickness of the sidewall insulating film in a direction parallel to the substrate surface seriously affects the size of the FET. To be more specific, where the side insulating film has a large thickness, the miniaturization of the FET is inhibited, which makes it difficult to increase the degree of integration. In addition, if the side insulating film has a large thickness, it is impossible to decrease the parasitic resistance of the diffusion layer, which inhibits improvements in the device characteristics.

On the other hand, Si—Al—O—N is used as the material of the sidewall insulating film 107 in this embodiment. It should be noted that Si—Al—O—N is an insulator and most of Si—Al—O—N has a closely dense crystal structure and exhibits a strong interatomic bond. It follows that, according to the present embodiment, it is possible to suppress the diffusion of the metal from the gate insulator 103 into the outer space in the step of the ion implantation for forming the source and drain regions 105, even if the thickness of the sidewall insulating film in a direction parallel to the substrate surface is somewhat decreased. In other words, the method according to the present embodiment permits manufacturing a semiconductor device excellent in performance and having a high degree of integration at a high yield.

Shown in the table given below are the typical properties of β-SIALON, which is a typical Si—Al—O—N in which Al and O are contained in β-$Si_3N_4$ in a manner to form a solid solution, and the properties of other insulating materials.

|  | β-SIALON | $Al_2O_3$ | AlN | $Si_3N_4$ | $SiO_2$ |
|---|---|---|---|---|---|
| Flexural strength (MPa) | 980 | 350 | 300 | 880 | 290 |
| Compressive strength (MPa) | ≧3500 | 2900 | 3000 | 2940 | 2000 |
| Young's modulus (GPa) | 340 | 400 | 320 | 290 | 200 |
| Hardness (GPa) | 16 | 15 | 14 | 16 | 12 |
| Thermal expansion coefficient (to 1000° C.) | $3.40 \times 10^{-6}$ | $7.90 \times 10^{-6}$ | $4.60 \times 10^{-6}$ | $3.20 \times 10^{-6}$ | $3.60 \times 10^{-6}$ |
| Thermal shock resistance (° C.) | 900 | 200 | 400 | 700 | — |

As shown in the table given above, Si—Al—O—N is excellent in mechanical strength and resistance to heat and exhibits a thermal expansion coefficient close to that of Si or $SiO_2$. For example, β-SIALON is markedly superior to $SiO_2$ used as a typical material of the sidewall insulating film in mechanical strength, i.e., the interatomic bonding force. Also, β-SIALON is superior to $Al_2O_3$, AlN and $Si_3N_4$ in mechanical strength. In addition, β-SIALON is superior to the other insulators in thermal shock resistance and, thus, is advantageous when used in a process accompanied by rapid changes in temperature, such as a laser annealing process or an RTA (Rapid Thermal Annealing) process. Further, β-SIALON has a thermal expansion coefficient close to that of Si, i.e., $3.5 \times 10^{-6}$ or $SiO_2$ and, thus, a β-SIALON layer is unlikely to peel.

Figure 3:
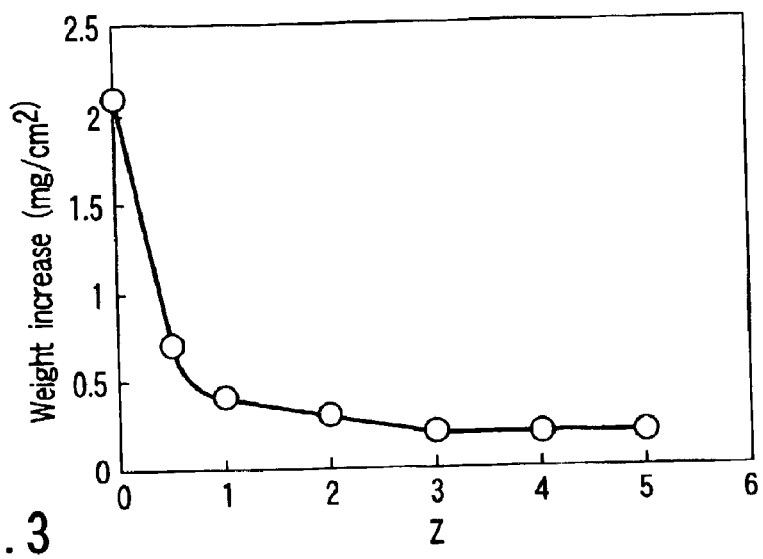
FIG. 3 is a graph exemplifying the relationship between the composition of Si—Al—O—N and the resistance to oxidation.

FIG. 3 is a graph exemplifying the relationship between the composition and the resistance to oxidation of Si—Al—O—N. The data given in FIG. 3 was obtained in the case where a Si—Al—O—N film having a composition represented by a general formula $Si_{6-z}Al_zO_zN_{8-z}$ was heated to 1,000° C. The value of z in the general formula given above is plotted on the abscissa and the weight increase per unit area is plotted on the ordinate.

As shown in FIG. 3, the weight increase of the $Si_3N_4$ film is prominently large in the case where the value of z is zero. However, the weight increase is decreased with increase in the value of z. Particularly, the weight increase is markedly decreased if the value of z is about 0.25 or more, and the weight increase is rendered substantially constant in the case where the value of z is not smaller than about 1. It follows that Si—Al—O—N is markedly superior to $Si_3N_4$ in the resistance to oxidation. Naturally, the use of Si—Al—O—N is advantageous in applying various semiconductor processes.

Si—Al—O—N may be either crystalline or amorphous. The amorphous Si—Al—O—N is substantially equal to the crystalline Si—Al—O—N in the properties referred to previously. It follows that, in the case of using Si—Al—O—N for forming the sidewall insulating film, it is possible to obtain a prominent barrier effect, i.e., the effect of suppressing the diffusion of a metal from the gate insulator 103 to the outer space in the ion implantation step, and the effect of suppressing the diffusion of the constituting element of the sidewall insulating film 10 to the outside. Also, Si—Al—O—N is a material that can be introduced easily into current semiconductor manufacturing and, thus, contributes to cost reduction.

Si—Al—O—N having the features described above has a characteristic network structure. The features described above are considered to be deeply related to the network structure.

Figure 4:
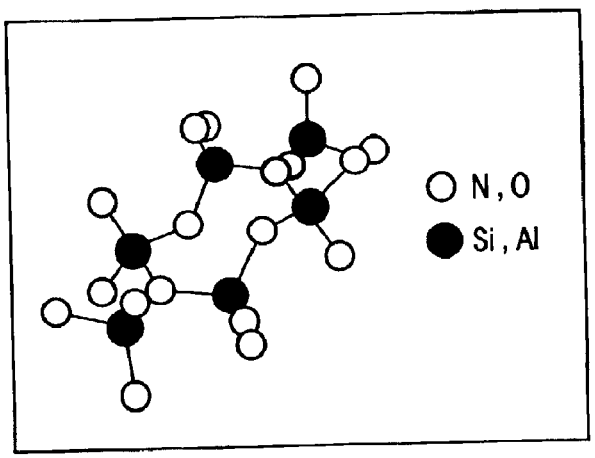
FIG. 4 schematically shows the construction of β-SIALON.

FIG. 4 schematically shows the construction of β-SIALON.

As described previously, in β-SIALON, Al and O are contained in β-$Si_3N_4$ in a manner to form a solid solution. Therefore, β-SIALON has a network structure similar to that of β-$Si_3N_4$. Since the constituting elements has a valency of $Si^{4+}$, $Al^{3+}$, $N^{3-}$, and $O^{2-}$, β-SIALON can be represented by the general formula given below:

$$Si_{6-x}Al_zO_zN_{8-z}$$

where the value of z is larger than 0 and smaller than 6.

It is desirable for the sidewall insulating film 7 to be small in interstice. Therefore, where β-SIALON is used as the material of the sidewall insulating film, it is desirable for the deviation of the composition of the sidewall insulating film from the stoichiometric value to be small.

Specifically, it is desirable that the deviation of the composition of the sidewall insulating film from the stoichiometric value falls within a range of about ±2 atomic %, since such a deviation does not significantly affect the properties of the material. It is also desirable that Al concentration in the sidewall insulating film 107 falls within a range of 3 to 45 atomic % and N concentration in the sidewall insulating film 107 falls within a range of 10 to 55 atomic %.

Figure 5:
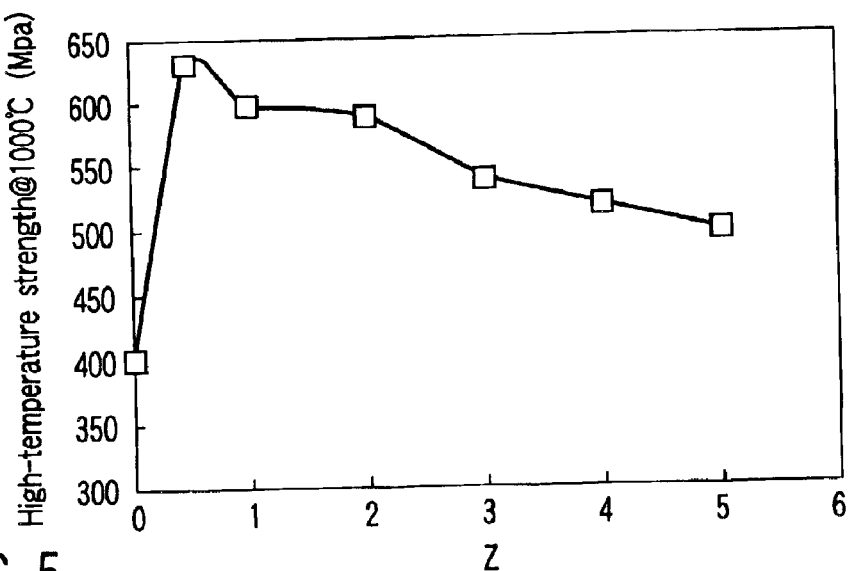
FIG. 5 is a graph showing the relationship between the composition of β-SIALON and the high temperature strength.

FIG. 5 is a graph showing the relationship between the composition and the high temperature strength of β-SIALON. In the graph of FIG. 5, the value of z is plotted on the abscissa, and the high temperature strength at 1,000° C. is plotted on the ordinate.

As shown in FIG. 5, it is possible to obtain a prominently large value of the high temperature strength in the case where the value of z falls within a range of between about 0.25 and about 5. Also, where the value of z is not smaller than 0.5, the change in the high temperature strength is small relative to the deviation in the value of z. Incidentally, if the value of z exceeds about 4.5, it is difficult for Al and O to form a solid solution. It follows that the composition of the sidewall insulating film 107 is likely to deviate from the stoichiometric composition. Also, if the value of z exceeds about 3, β-SIALON of the trigonal system tends to be mixed with Si—Al—O—N of another crystal system such as β-SIALON of the hexagonal system, which easily contains a defect and a metal impurity.

It is possible for the sidewall insulating film 107 to contain elements other than Si, Al, O and N, though the barrier effect referred to previously fails to be produced prominently if the ratio occupied by Si, Al, O and N within the sidewall insulating film is lowered. If the concentration M of the elements other than Si, Al, O and N exceeds 3 atomic % in the sidewall insulating film 107, formed is a compound having a composition represented by $MSi_3Al_9O_3N_{13}$, with the result that a coarse network structure tends to be formed easily, as in β-SIALON. If the network structure is rendered coarse, the barrier effect referred to previously is lowered. It follows that it is desirable for the sum of the concentrations of aluminum, silicon, oxygen and nitrogen within the sidewall insulating film 107 to be not smaller than 97 atomic %. Also, in order to obtain SIALON that is not accompanied by strain and is excellent in strength (i.e., β-SIALON and/or similar stable phase), it is desirable for the sum of the concentrations noted above to be not smaller than 99 atomic %.

It is possible for the composition of Si—Al—O—N in the sidewall insulating film 107 to be set on the basis of, for example, the density and the dielectric constant.

Figure 6:
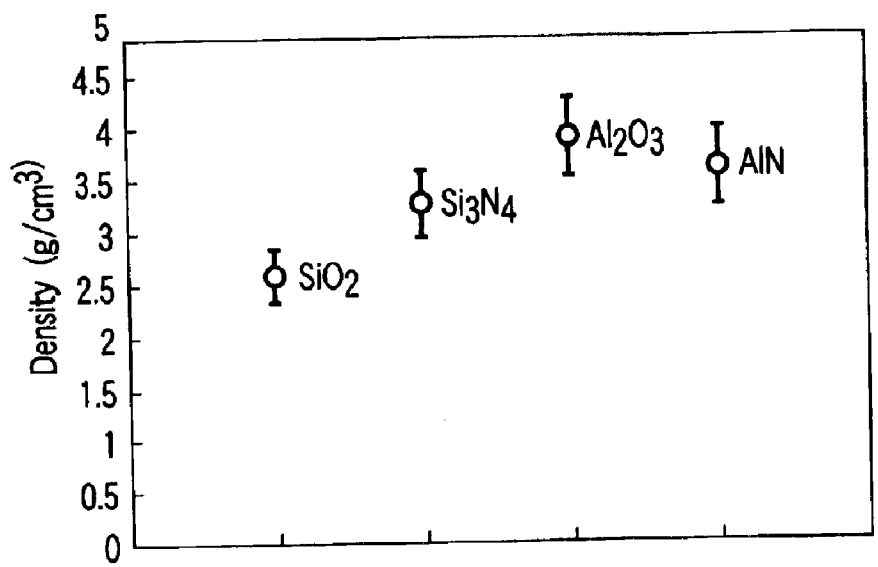
FIG. 6 is a graph showing the densities of $SiO_2$, $Al_2O_3$, AlN and $Si_3N_4$.
Figure 7:
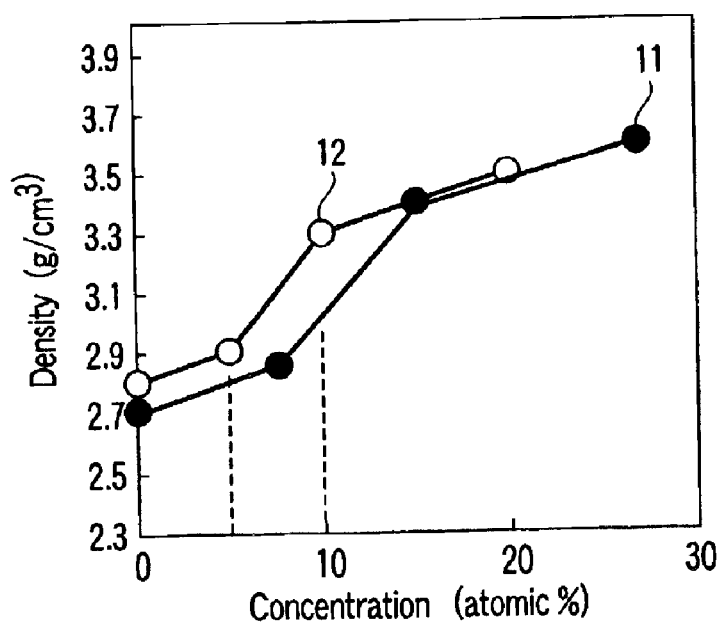
FIG. 7 is a graph exemplifying the relationship obtained from the densities shown in FIG. 6 between the composition of Si—Al—O—N and the density.

FIG. 6 is a graph showing the densities of $SiO_2$, $Al_2O_3$, AlN and $Si_3N_4$. On the other hand, FIG. 7 is a graph exemplifying the relationship between the composition and the density of Si—Al—O—N, which was obtained from the densities given in FIG. 6. In the graph of FIG. 7, the Al concentration and the N concentration in Si—Al—O—N are plotted on the abscissa. Also, the data denoted by a reference numeral 11 in FIG. 7 represent the data obtained under the condition that Al concentration is varied. On the other hand, the data denoted by a reference numeral 12 in FIG. 7 represent the data obtained under the condition that N concentration is varied.

As shown in FIG. 7, the density is markedly increased, if the Al concentration is 10 atomic % or more. Also, the density is markedly increased, if the N concentration is 5 atomic % or more. The density of Si—Al—O—N is deeply related to the compactness thereof. It follows that it is desirable for the Al concentration to be not lower than 10 atomic % and for the N concentration to be not lower than 5 atomic %.

Figure 8:
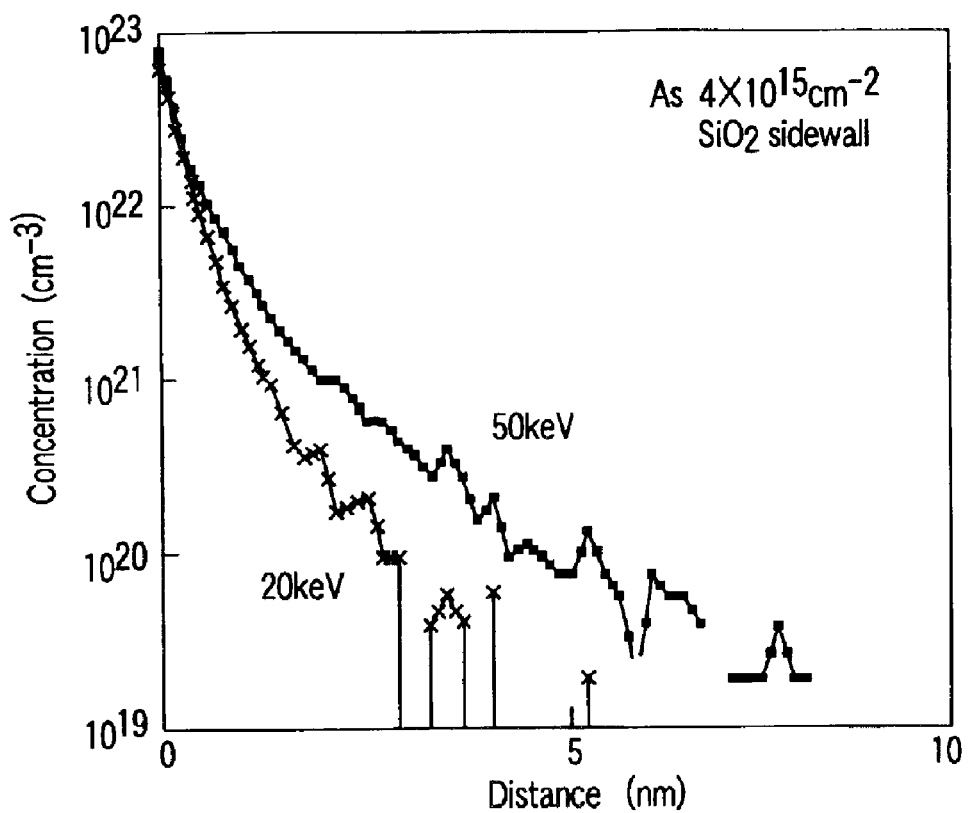
FIG. 8 is a graph exemplifying the diffusion of the metal element caused by the ion implantation in the case of using a SiO₂ film as the sidewall insulating film.

FIG. 8 is a graph exemplifying the diffusion of a metal element generated by the ion implantation in the case of using a $SiO_2$ film as a sidewall insulating film. Incidentally, the data given in FIG. 8 was obtained by calculation on the assumption that a Zr silicate film containing 15 atomic % of Zr was used as the gate insulator and As was introduced by means of an ion implantation under an acceleration energy of 20 keV or 50 keV and at a dose of $4 \times 10^{15}$ $cm^{-1}$. In the graph of FIG. 8, the distance of the position of the sidewall insulating film from the gate insulator is plotted on the abscissa, and the Zr concentration in the position of the sidewall insulating film is plotted on the ordinate. As shown in FIG. 8, Zr is present even if the distance of the position from the gate insulator is 8 nm to 10 nm in the case of using a $SiO_2$ as the sidewall insulating film and setting the acceleration energy at 50 keV.

Figure 9:
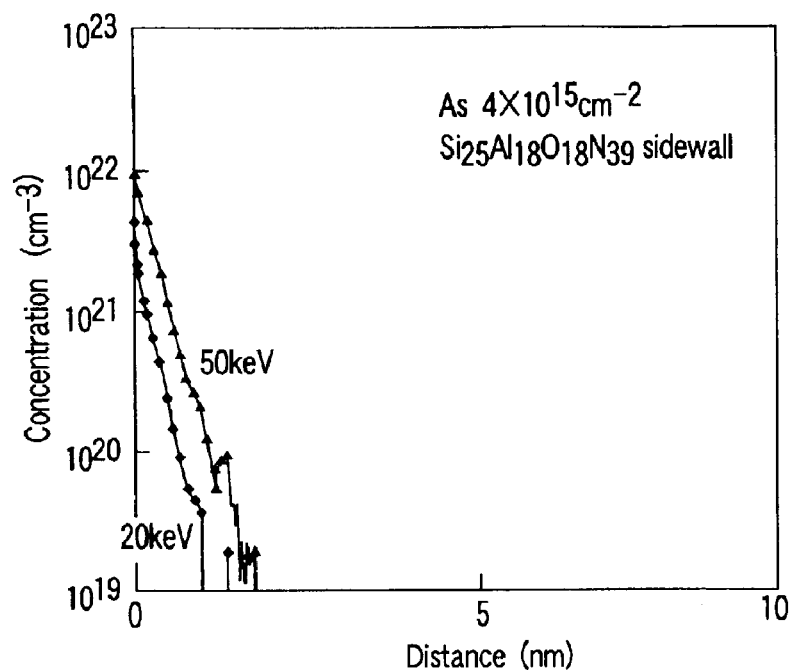
FIG. 9 is a graph exemplifying the diffusion of the metal element caused by the ion implantation in the case of using a Si—Al—O—N film as the sidewall insulating film 107.

FIG. 9 is a graph exemplifying the diffusion of a metal element generated by the ion implantation in the case of using a Si—Al—O—N film as the sidewall insulating film 107. Incidentally, the data given in FIG. 9 was obtained by calculation on the assumption that a Zr silicate film containing 15 atomic % of Zr was used as the gate insulator 103, that the atomic ratio of Si:Al:O:N in the sidewall insulating film was set at 25:18:18:39, i.e. Z value of 0.25, and that the ion implantation of As was carried out under an acceleration energy of 20 keV or 50 keV and at a dose of $4 \times 10^{15}$ $cm^{-1}$. In the graph of FIG. 9, the distance of the position of the sidewall insulating film from the gate insulator is plotted on the abscissa, and the Zr concentration in the position of the sidewall insulating film is plotted on the ordinate.

As shown in FIG. 9, in the case where a Si—Al—O—N film was used as the sidewall insulating film 107 and the acceleration energy was set at 50 keV, Zr was scarcely present in the position 2 nm to 3 nm apart from the gate insulator. In other words, in the case of using a Si—Al—O—N film as the sidewall insulating film 107, it is possible to obtain an excellent barrier effect, i.e., the effect of suppressing the diffusion of a metal from the gate insulator 103 to the outer space caused by the ion implantation, compared with the case of using a $SiO_2$ film as the sidewall insulating film 107.

Figure 10:
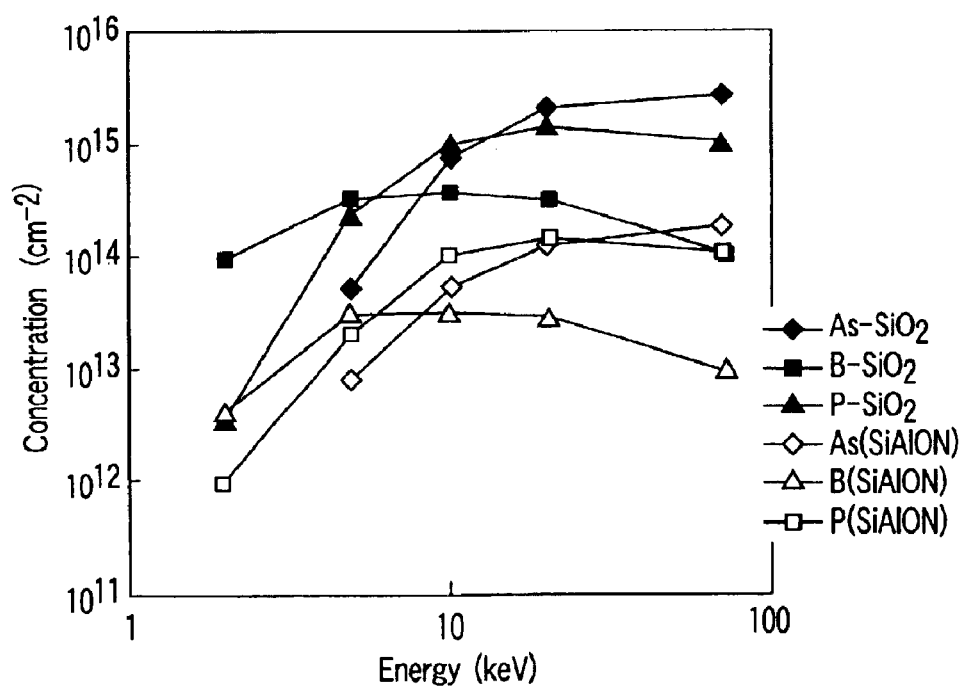
FIG. 10 is a graph exemplifying the relationship between the acceleration energy in the stage of the ion implantation and the concentration of the metal diffused from the gate insulator.

FIG. 10 is a graph exemplifying the relationship between the acceleration energy in the step of the ion implantation and the concentration of the metal diffused from the gate insulator. Incidentally, the data given in FIG. 10 was obtained by calculation on the assumption that a dose was set at $4 \times 10^{15}$ $cm^{-2}$ and that As, P and B were introduced by the ion implantation. Also, the data denoted by "SiAlON" in FIG. 10 was obtained in the case where the atomic ratio of the elements contained in the sidewall insulating film was set at: Si:Al:O:N=12:30:30:28. Further, in the graph of FIG. 10, the acceleration energy is plotted on the abscissa, and the Hf concentration in the sidewall insulating film 107 in the position 5 nm apart from the gate insulator 103 is plotted on the ordinate.

As apparent from the data given in FIG. 10, a more prominent barrier effect can be obtained regardless of the kind of impurity introduced when using Si—Al—O—N as the material of the sidewall insulating film 107, compared with using $SiO_2$ as the material of the sidewall insulating film 107.

As described above, the use of Si—Al—O—N as the material of the sidewall insulating film 107 permits obtaining a prominent barrier effect even where the thickness of the sidewall insulating film 107 in a direction parallel to the substrate surface is decreased. It follows that it is possible to decrease the distance between the source and drain diffusion layers and to suppress the parasitic capacitance between the gate and the diffusion layers.

Various methods, such as a sputtering method or a CVD method, can be employed for forming a Si—Al—O—N film.

In the case of employing the sputtering method, it is possible to employ an RF sputtering method using a sintered body of Si—Al—O—N having a desired composition as a target. In this case, however, the N atoms tend to be deficient in the film and, thus, it is desirable to carry out the sputtering treatment under a nitrogen gas atmosphere. For example, in the case of an Ar sputtering, it is possible to introduce nitrogen into the film at a high concentration by setting the flow rate ratio of the Ar gas to the $N_2$ gas at about 1:1. Also, since oxygen is strongly reactive, it is possible to introduce oxygen into the film at a high concentration even if the flow rate ratio of the Ar gas to the $O_2$ gas is set at about 10:1.

Also, it is possible to form a Si—Al—O—N film by simultaneous sputtering using three kinds of target, as denoted by the reaction formula given below:

$$(6-z)Si_3N_4+(z)AlN+(z)Al_2O_3 \rightarrow 3Si_{6-z}Al_zO_zN_8$$

In this case, it is desirable to use, for example, plasma in order to allow the reaction to proceed sufficiently.

In the case of utilizing the CVD method, it is possible to use, for example, a $SiCl_4$ gas, an $NH_3$ gas and an $AlCl_3$ gas as the raw material gases. In this case, a $SiCl_4$ gas, an $NH_3$ gas, an $AlCl_3$ gas and $H_2O$ are supplied under a pressure of $10^4$ Pa to $10^5$ Pa, and the reaction is accelerated by using heat or plasma. As a result, $Si_3N_4$ and $Al_2O_3$ are formed and, at the same time, a reaction is carried out between these formed compounds so as to form Si—Al—O—N. The composition of Si—Al—O—N can be controlled by controlling the flow rates of the raw material gases. Also, since the processing under a high temperature not lower than 1,400° C. is required in general in order to obtain a dense film under the pressure not higher than $10^4$ Pa, it is desirable for the gas pressure to be not lower than $10^4$ Pa. Also, since $H_2O$ is supplied, it is possible to utilize the reaction formula: $H_2+CO_2 \leftrightarrows H_2O+CO$. It is also possible to use an organic gas such as an $Al(OC_3H_5)_3$ gas as the raw material gas. The hydrolysis using $H_2O$ is useful in this case, too. However, it is also advisable to use a strong oxidizing agent, such as NO, in order to promote the reaction. Further, it is advisable to use $SiH_4$ as the raw material of Si. At any rate, since the reaction process under a relatively high temperature or an equivalent process is required for obtaining a high quality film, it is desirable to assist the reaction within the reaction furnace by using plasma.

Incidentally, the semiconductor device according to one embodiment of the present invention and the method of manufacturing the same are described above with reference to FIGS. 1 and 2A to 2I. However, the present invention is not limited to the embodiment covered by these drawings.

For example, in the case where the ion implantation for forming the source and drain regions 105 is carried out under a lower acceleration energy, it is possible to further decrease the thickness of the sidewall insulating film in a direction parallel to the substrate surface. To be more specific, it is possible to set the thickness of the sidewall insulating film 107 to fall within a range of between 3 nm and 10 nm.

Also, the composition of Si—Al—O—N can be set optionally, although it is desirable that the composition of Si—Al—O—N is determined such that Si—Al—O—N forms the network structure. For example, it is possible to further lower the Al concentration and the N concentration. Also, in order to allow the electric field generated from the gate electrode 104 to act more effectively on the surface region of the silicon substrate 101, it is possible to further increase the Al concentration and the N concentration in the Si—Al—O—N film so as to increase the dielectric constant of the Si—Al—O—N film. Alternatively, in order to decrease the parasitic capacitance so as to shorten the delay time in the driving of the transistor, it is possible to further increase the Si concentration and the O concentration in the Si—Al—O—N film.

Where it is necessary for the thickness of the side insulating film in a direction parallel to the substrate surface to be thicker, as in the case where an ion implantation of a low concentration is required, it is possible to form first a Si—Al—O—N film as a first sidewall insulating film, followed by forming a second sidewall insulating film made of another material such as $SiO_2$ on the side surface of the first sidewall insulating film. Also, where it is desired that the electric field generated from the gate electrode 104 acts more effectively on the surface region of the silicon substrate 101 in accordance with progress in the miniaturization and with increase in the dielectric constant of the gate insulator 103 and, therefore, utilization of a metal oxide with high dielectric constant as a material of the sidewall insulating film 107 is desired, it is possible to form first a film of a metal oxide having a high dielectric constant as a first sidewall insulating film, followed by forming a Si—Al—O—N film on the first sidewall insulating film as a second sidewall insulating film. In other words, it is possible for the sidewall insulating film 107 to be of a multi-layered structure including a Si—Al—O—N film and a film made of another material.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a silicon substrate;
   a gate insulator disposed on the silicon substrate and containing a metal oxide;
   a gate electrode disposed on the gate insulator; and
   a sidewall insulating film covering a side surface of the gate insulator and a side surface of the gate electrode and containing aluminum, silicon, oxygen and nitrogen.

2. The device according to claim 1, wherein at least a part of the sidewall insulating film has a composition represented by a general formula:

$$Si_{6-z}Al_zO_zN_{8-z}$$

where z is a value larger than 0 and smaller than 6.

3. The device according to claim 1, wherein a sum of concentrations of aluminum, silicon, oxygen and nitrogen in the sidewall insulating film is equal to or larger than 97 atomic %.

4. The device according to claim 1, wherein a thickness of the sidewall insulating film in a direction parallel to a main surface of the silicon substrate falls within a range from 3 nm to 10 nm.

5. The device according to claim 1, wherein a concentration of aluminum in the sidewall insulating film is equal to or larger than 10 atomic %, and a concentration of nitrogen in the sidewall insulating film is equal to or larger than 5 atomic %.

6. The device according to claim 1, wherein a material of the gate insulator is silicate of the metal oxide and silicon dioxide, and the metal oxide contains as a constituent metal element thereof at least one metal element selected from the group consisting of zirconium, hafnium, lanthanum, cerium, titanium, yttrium, tantalum, bismuth and praseodymium.

7. The device according to claim 1, wherein the gate insulator consists essentially of the metal oxide, and the metal oxide contains as a constituent metal element thereof at least one metal element selected from the group consisting of zirconium, hafnium, lanthanum, cerium, titanium, yttrium, tantalum, bismuth and praseodymium.

8. A semiconductor device comprising:
a silicon substrate;
a gate insulator disposed on the silicon substrate and containing a metal oxide;
a gate electrode disposed on the gate insulator; and
a sidewall insulating film covering a side surface of the gate insulator and a side surface of the gate electrode and having a network structure constructed by aluminum, silicon, oxygen and nitrogen.

9. The device according to claim 8, wherein at least a part of the sidewall insulating film has a composition represented by a general formula:

$$Si_{6-z}Al_zO_zN_{8-z}$$

where z is a value larger than 0 and smaller than 6.

10. The device according to claim 8, wherein a sum of concentrations of aluminum, silicon, oxygen and nitrogen in the sidewall insulating film is equal to or larger than 97 atomic %.

11. The device according to claim 8, wherein a thickness of the sidewall insulating film in a direction parallel to a main surface of the silicon substrate falls within a range from 3 nm to 10 nm.

12. The device according to claim 8, wherein a concentration of aluminum in the sidewall insulating film is equal to or larger than 10 atomic %, and a concentration of nitrogen in the sidewall insulating film is equal to or larger than 5 atomic %.

13. The device according to claim 8, wherein a material of the gate insulator is silicate of the metal oxide and silicon dioxide, and the metal oxide contains as a constituent metal element thereof at least one metal element selected from the group consisting of zirconium, hafnium, lanthanum, cerium, titanium, yttrium, tantalum, bismuth and praseodymium.

14. The device according to claim 8, wherein the gate insulator consists essentially of the metal oxide, and the metal oxide contains as a constituent metal element thereof at least one metal element selected from the group consisting of zirconium, hafnium, lanthanum, cerium, titanium, yttrium, tantalum, bismuth and praseodymium.

* * * * *